United States Patent
Xie

(10) Patent No.: US 8,592,229 B2
(45) Date of Patent: Nov. 26, 2013

(54) METHOD FOR FORMING DUAL DAMASCENE STRUCTURE

(75) Inventor: Yong-Gang Xie, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 189 days.

(21) Appl. No.: 12/244,736

(22) Filed: Oct. 2, 2008

(65) Prior Publication Data

US 2010/0087018 A1    Apr. 8, 2010

(51) Int. Cl.
*G01R 31/26*    (2006.01)

(52) U.S. Cl.
USPC .................................. 438/16; 257/E21.53

(58) Field of Classification Search
USPC ............ 438/16, 81, 597, 618, 622–624, 629, 438/634, 636–638, 640, 668, 672, 675, 687, 438/689, 694, 700, 738, 745, 790; 257/48, 257/446, 499, 734, 750–753, 758, 762, 774, 257/E21.249, E21.495, E21.577–E21.579, 257/E23.169

See application file for complete search history.

(56) References Cited

U.S. PATENT DOCUMENTS

| | | | |
|---|---|---|---|
| 6,211,068 B1 * | 4/2001 | Huang | 438/634 |
| 6,432,814 B1 * | 8/2002 | Steiner et al. | 438/624 |
| 6,562,711 B1 * | 5/2003 | Powers | 438/622 |
| 2006/0063376 A1 * | 3/2006 | Lee et al. | 438/638 |
| 2007/0205507 A1 * | 9/2007 | Chang et al. | 257/734 |

\* cited by examiner

*Primary Examiner* — Julio J Maldonado
*Assistant Examiner* — Robert Bachner
(74) *Attorney, Agent, or Firm* — Winston Hsu; Scott Margo

(57) ABSTRACT

A method for forming a dual damascene structure is disclosed. First a substrate is provided. There are an etching stop layer and an interlayer dielectric layer disposed on the substrate in order. The interlayer dielectric layer has a thickness A. Second, the interlayer dielectric layer is patterned to form a first opening. Later, a photo resist layer with a thickness B is formed on the interlayer dielectric layer. Then, the photo resist layer is patterned by a light source to construct a patterned photo resist layer. Later, the interlayer dielectric layer is again patterned by the patterned photo resist to pattern the interlayer dielectric layer to construct a second opening on the first opening by means of a light source and the photo resist layer so as to form a dual damascene structure. The light source has a periodic parameter C so that $(A+B)/C \approx X/2$, where X is an odd number.

18 Claims, 6 Drawing Sheets

METHOD FOR FORMING DUAL DAMASCENE STRUCTURE

BACKGROUND OF THE INVENTION

1. Field of the Invention

The present invention relates to a method for forming a dual damascene structure. In particular, the present invention relates to a method for forming a dual damascene structure by calculating a periodic parameter.

2. Description of the Prior Art

In the manufacturing process of semiconductors, metals are used for the formation of interconnect of elements. Aluminum used to be used for the formation of interconnect of elements. However, with the shrinkage of the element critical dimension (CD) and the obvious behavior of electromigration, aluminum is less and less qualified to be used for the formation of interconnect of elements. Currently, copper is generally used to replace aluminum for the formation of interconnect of elements because copper has a much lower electric resistance, better RC delay time and weaker behavior of electromigration.

In addition to the much lower electric resistance, the reasons why copper is chosen to replace aluminum resides in that copper has a higher melting point and much higher thermal conductivity coefficient than aluminum does, so copper may form thin films by dry process such as chemical vapor deposition plus physical chemical vapor deposition or by wet process such as physical chemical vapor deposition to form seed layer plus electroplating. For such reasons, copper is highly appreciated in the multilayer metal interconnect in the coming generations.

However, there are severe problems coming with the usage of copper to replace aluminum for the formation of interconnect of elements, which are highly incompatible with the conventional Al process, i.e. the copper wires cannot be patterned by the conventional methods used to pattern the Al wires. On one hand, copper fails to form highly volatile chlorides so the dry etching techniques used in the conventional Al process cannot be applied in the copper process. On the other hand, because the wet etching of copper suffers severe under-cut, the narrower the line width the severer the problem, the only practical method available on the production line is the damascene process.

The feature of the damascene process is that copper is deposited in the openings such as trenches or vias in the dielectric layers. The trenches and vias are usually defined in the dielectric layer by lithographic and etching steps. On one hand, the damascene process includes the single damascene process and the dual damascene process. Only one of trenches and vias is formed in the single damascene process. In the dual damascene process, trenches and vias are overlapped to form in the same position. On the other hand, based on the etching fashions of the dielectric layers, the damascene technique may be classified into various types such as "trench first" or "via first," each with its different technical problems.

FIGS. 1-5 illustrate an example of forming a dual damascene structure in the prior art. Taking the damascene process for forming vias for example, first a substrate 101 is provided. A layer of meal 102 is already formed in the substrate 101 in advance. There is an interlayer dielectric layer 103 with a thickness A on the substrate 101. Second, the vias for the damascene structure are required to be formed in the interlayer dielectric layer 103 as the bridge of the electric connections for the metal layer 102. The method for forming the vias for the damascene structure is that, as shown in FIG. 2, a layer of photo resist 104 is first formed on the interlayer dielectric layer 103. Then, as shown in FIG. 3, the photo resist layer 104 is patterned to form the pattern opening 105. Later, the interlayer dielectric layer 103 is etched using the patterned photo resist layer 104 as an etching mask to construct the via 106 exposing the substrate 101 in the interlayer dielectric layer 103. Please note that the photoresist is consumed during the etching of the interlayer dielectric layer 103, so the thickness of the photo resist layer 104 in FIG. 3 and in FIG. 4 is different.

Although the interlayer dielectric layer 103 is indeed at least partially removed by the etching, not all of the vias 106 may expose the substrate 101 due to reasons such as high aspect ratio and lithographic and etching technical problems. Once the via 106 does not expose the substrate 101, as shown in FIG. 4, no effective metal interconnect structure 107 to the metal layer 102 can be formed even if copper is successfully filled in the via 106. The elements in the semiconductor therefore fail due to lack of proper electric connections, as shown in FIG. 5.

Accordingly, a method for forming a dual damascene structure is needed in order to thoroughly remove all the materials of the interlayer dielectric layer in the vias during the etching of the interlayer dielectric layer so that an effective metal interconnect structure to the metal layer can be formed to ensure good electric connections between the elements in the semiconductor.

SUMMARY OF THE INVENTION

The present invention proposes a method for forming a dual damascene structure. In the method for forming a dual damascene structure of the present invention, a periodic parameter is taken into consideration so that all the materials of the interlayer dielectric layer in the vias can be thoroughly removed during the etching of the interlayer dielectric layer. An effective metal interconnect structure is hence formed.

The present invention first provides a method for forming a dual damascene structure. In the beginning, a substrate is provided. There are an etching stop layer and an interlayer dielectric layer disposed on the substrate in order. The interlayer dielectric layer has a thickness A. Second, the interlayer dielectric layer is patterned to form a first opening. Later, a photo resist layer with a thickness B is formed on the interlayer dielectric layer. Then, the photo resist layer is patterned by a light source to construct a patterned photo resist layer. Later, the interlayer dielectric layer is again patterned by the patterned photo resist layer to construct a second opening on the first opening by means of a light source and the photo resist layer so as to form a dual damascene structure. The light source has a periodic parameter C so that $(A+B)/C \approx X/2$, where X is an odd number.

The present invention again provides a method for forming a dual damascene structure. In the beginning, a substrate is provided. There are an etching stop layer and an interlayer dielectric layer disposed on the substrate in order. The interlayer dielectric layer has a thickness A. Second, the interlayer dielectric layer is patterned to form a first opening. Later, a photo resist layer with a thickness B is formed on the interlayer dielectric layer. Afterwards, a top anti-reflective coating (TARC) layer is formed on the photo resist layer. Then, the photo resist layer and the top anti-reflective coating (TARC) layer are patterned by a light source to construct a patterned photo resist layer and a patterned the top anti-reflective coating (TARC) layer. Later, the interlayer dielectric layer is again patterned by the patterned photo resist layer and the patterned the top anti-reflective coating (TARC) layer to construct a second opening on the first opening so as to form a dual damascene structure. The light source has a periodic parameter C so that $(A+B)/C \approx N$, where N is a natural number.

The present invention further provides a method for determining the thickness of a photo resist layer. In the beginning, a substrate is provided. There are an etching stop layer and an interlayer dielectric layer disposed on the substrate in order. The interlayer dielectric layer has a thickness A. Second, the interlayer dielectric layer is patterned to form a first opening. Later, a photo resist layer with a thickness B is formed on the interlayer dielectric layer. Then, the photo resist layer is patterned by a light source to construct a patterned photo resist layer. Later, the interlayer dielectric layer is again patterned by the patterned photo resist layer to construct a second opening on the first opening so as to form a dual damascene structure. The light source has a periodic parameter C so that $B \approx (C*X-2A)/2$, where X is an odd number.

The present invention still provides a method for determining the thickness of a photo resist layer. In the beginning, a substrate is provided. There are an etching stop layer and an interlayer dielectric layer disposed on the substrate in order. The interlayer dielectric layer has a thickness A. Second, the interlayer dielectric layer is patterned to form a first opening. Later, a photo resist layer with a thickness B is formed on the interlayer dielectric layer. Afterwards, a top anti-reflective coating (TARC) layer is formed on the photo resist layer. Then, the photo resist layer and the top anti-reflective coating (TARC) layer are patterned by a light source to construct a patterned photo resist layer and a patterned the top anti-reflective coating (TARC) layer. Later, the interlayer dielectric layer is again patterned by the patterned photo resist layer and the patterned the top anti-reflective coating (TARC) layer to construct a second opening on the first opening so as to form a dual damascene structure. The light source has a periodic parameter C so that $B \approx C*N-A$, where N is a natural number.

In the method for forming a dual damascene structure and for determining the thickness of a photo resist layer of the present invention, a periodic parameter is taken into consideration so that a correct etching depth can be reached and all the materials of the interlayer dielectric layer in the vias can be thoroughly removed by etching during the etching of the interlayer dielectric layer. An effective metal interconnect structure is hence formed to ensure good electric connections between the elements in the semiconductor.

These and other objectives of the present invention will no doubt become obvious to those of ordinary skill in the art after reading the following detailed description of the preferred embodiment that is illustrated in the various figures and drawings.

DETAILED DESCRIPTION

The present invention proposes a method for forming a dual damascene structure and for determining the thickness of a photo resist layer. In the method for forming a dual damascene structure and for determining the thickness of a photo resist layer of the present invention, because a periodic parameter derived from the exposure light source is taken into consideration, it facilitates the estimation of the correct thickness of the photo resist layer. As a result, a correct etching depth can be reached and all the materials of the interlayer dielectric layer and the photo resist layer in the vias can be thoroughly removed by lithography and etching during the following etching procedure of the interlayer dielectric layer. An effective metal interconnect structure is hence formed to ensure good electric connections between the elements in the semiconductor.

Figure 1:
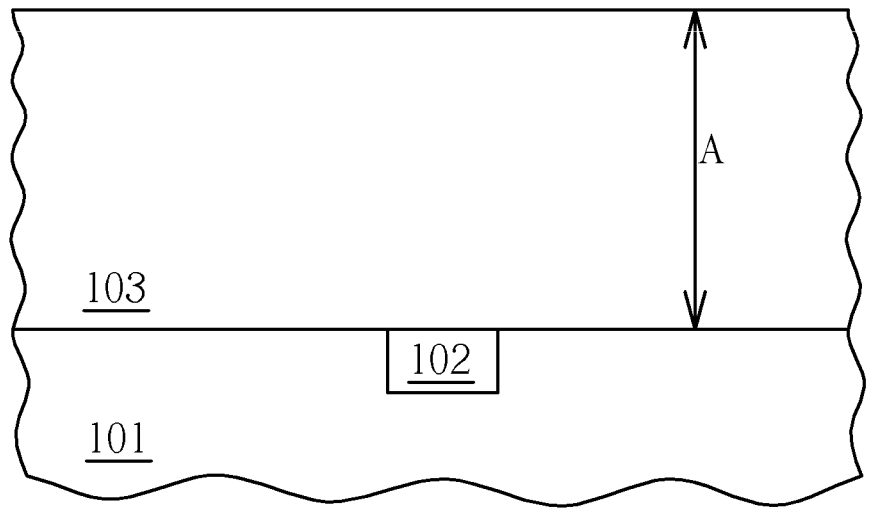
FIGS. 1-5 illustrate an example of forming a dual damascene structure in the prior art.
Figure 2:
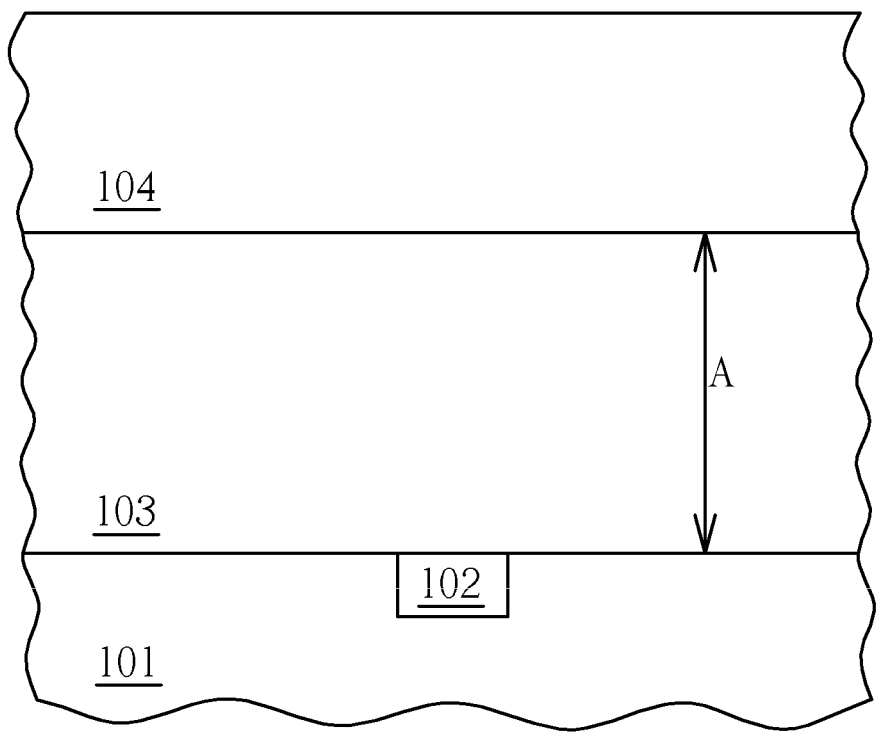
Figure 3:
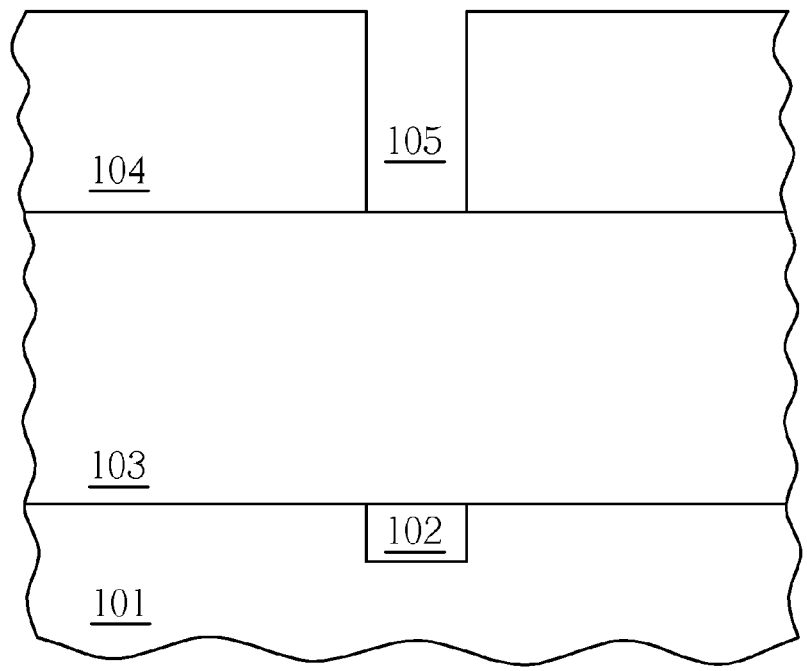
Figure 4:
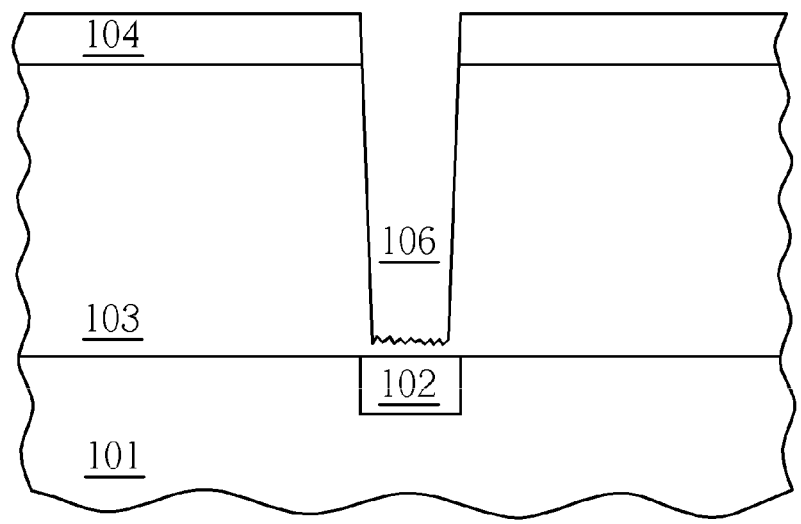
Figure 5:
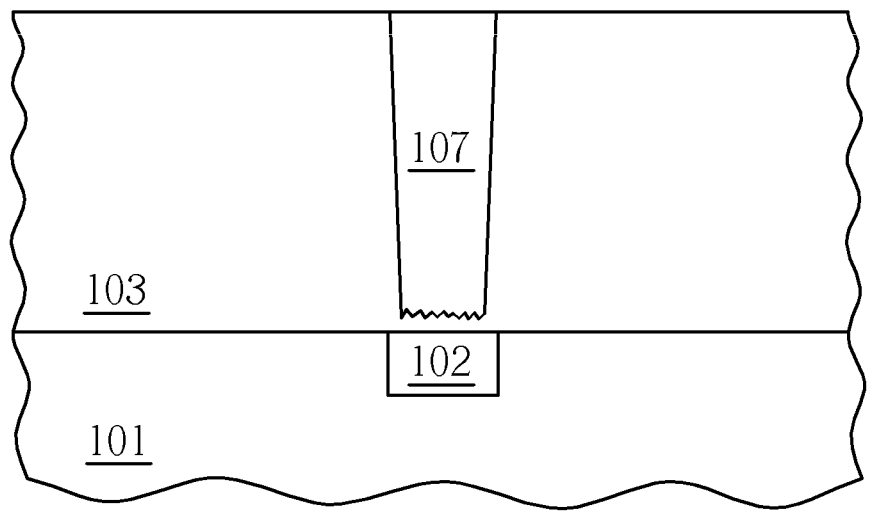
Figure 6:
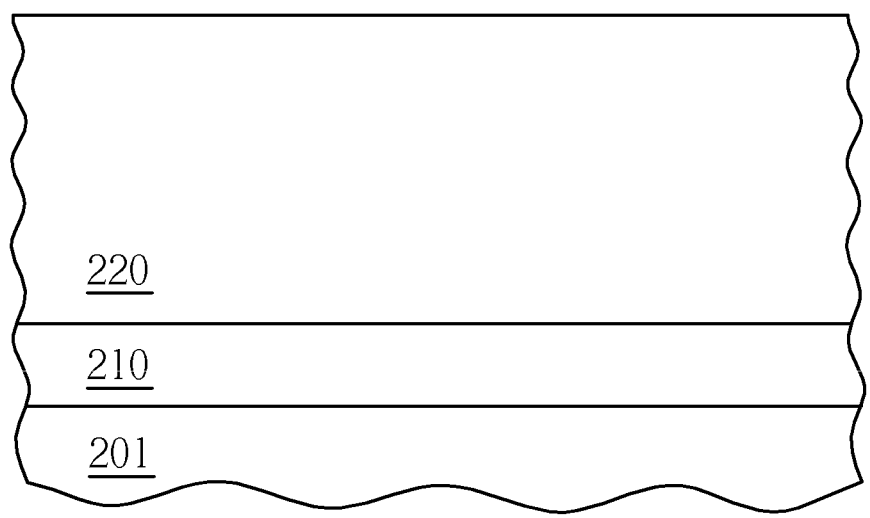
FIGS. 6-12 illustrate a preferred embodiment of the method for forming a dual damascene structure of the present invention.

The present invention first provides a method for forming a dual damascene structure. FIGS. 6-11 illustrate a preferred embodiment of the method for forming a dual damascene structure of the present invention. As shown in FIG. 6, a substrate 201 is provided. There are an etching stop layer 210 and an interlayer dielectric layer 220 disposed on the substrate 201 in order. The substrate 201 may be a semiconductor substrate, such as Si substrate or SOI, or a semiconductor substrate with at least a layer of metal interconnection. The etching stop layer 210 may be of a material different from that of the substrate 201 and the interlayer dielectric layer 220, such as silicon nitride, silicon carbide, silicon oxynitride, titanium nitride, or metal with a thickness of (to be supplemented). If the etching stop layer 210 is nitride or carbide, the interlayer dielectric layer 220 may include silicon oxide or a low-k material. The interlayer dielectric layer 220 may have a composite structure, such as silicon oxide, silicon fluoro-oxide (SiOF), SiLK, phospho-silicate glass (PSG), boro-phospho-silicate glass (BPSG), tetraethoxysilane (TEOS), fluoro-silicate glass (FSG) or silicon oxide with a thickness up to thouands of Ås.

Figure 7:
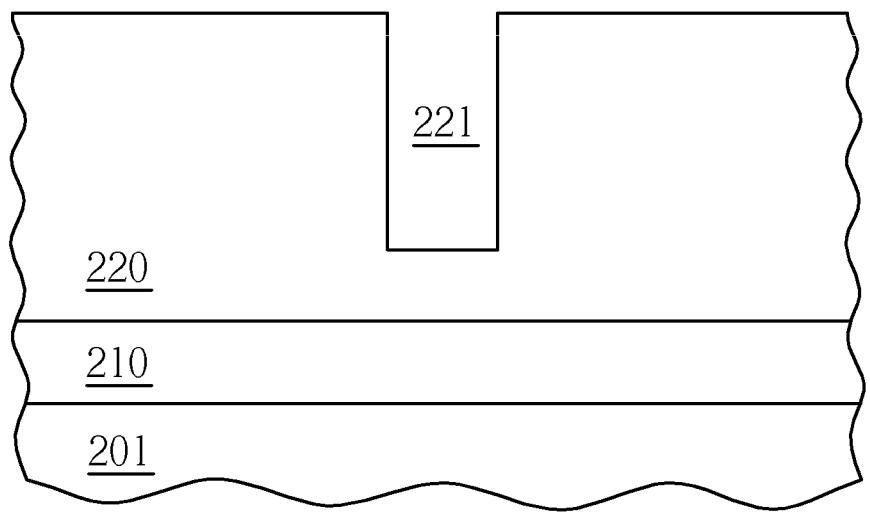

Second, as shown in FIG. 7, the interlayer dielectric layer 220 is patterned to form a first opening 221. Preferably, the first opening 221 is the via in the dual damascene structure. The method for forming the first opening 221 may be, first covering the interlayer dielectric layer 220 with a photo resist (not shown), patterning the photo resist by a lithographic process, etching the interlayer dielectric layer 220 using the photo resist (not shown) as a mask to form the first opening 221, then removing the photo resist (not shown).

Figure 8:
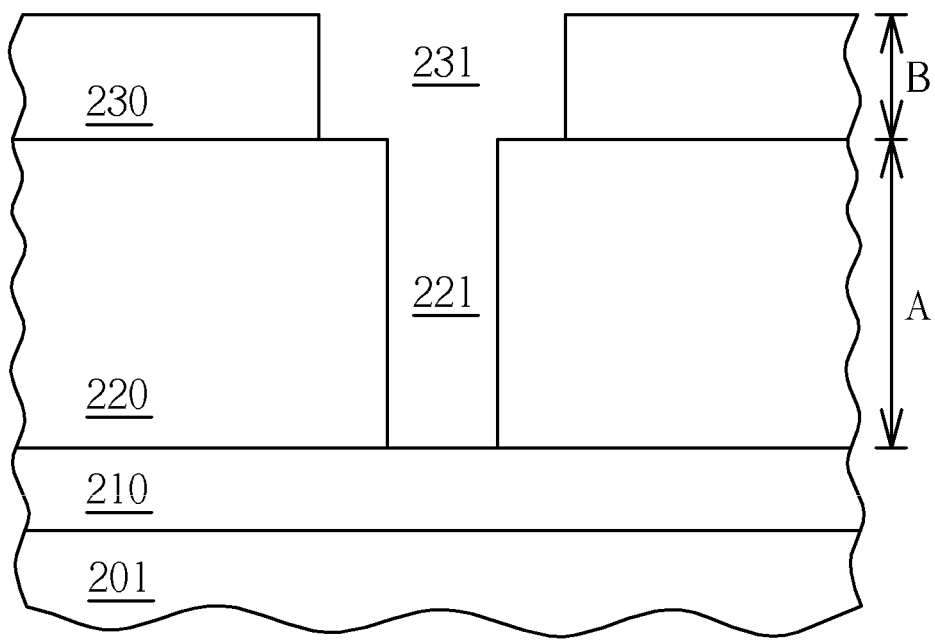

Please note that, the first opening 221 may or may not expose the etching stop layer 210. Only the exposed etching stop layer 210 is illustrated. However, the present invention includes both embodiments. As shown in FIG. 8, if the etching stop layer 210 is exposed, the total thickness to be exposed is A+B. On the other side, if the etching stop layer 210 is not exposed, the total thickness to be exposed is the depth of the first opening +B.

Later, the trench 222, i.e. the second opening, of the dual damascene structure is to be formed, and simultaneously the first opening 221 goes deeper into the interlayer dielectric layer 220 to expose the etching stop layer 210. The method for forming the trench 222 of the dual damascene structure may be, first forming a photo resist layer 230 on the interlayer dielectric layer 220, preferably the photo resist layer 230 filling the first opening 221, and patterning the photo resist layer 230 by a lithographic process so that the first opening 221 has a photo resist opening 231. Not only does the photo resist opening 231 expose the first opening 221, but it also defines the profile of the trench 222, as shown in FIG. 8.

However, as described earlier, persons of ordinary skills in the art encounter a problem. Though the photo resist layer 230 is used as a hard mask to again etch the interlayer dielectric layer 220 and some of the interlayer dielectric layer 220 is indeed removed, not all of the vias expose the etching stop layer 210 due to the technical hindrances.

Figure 9:
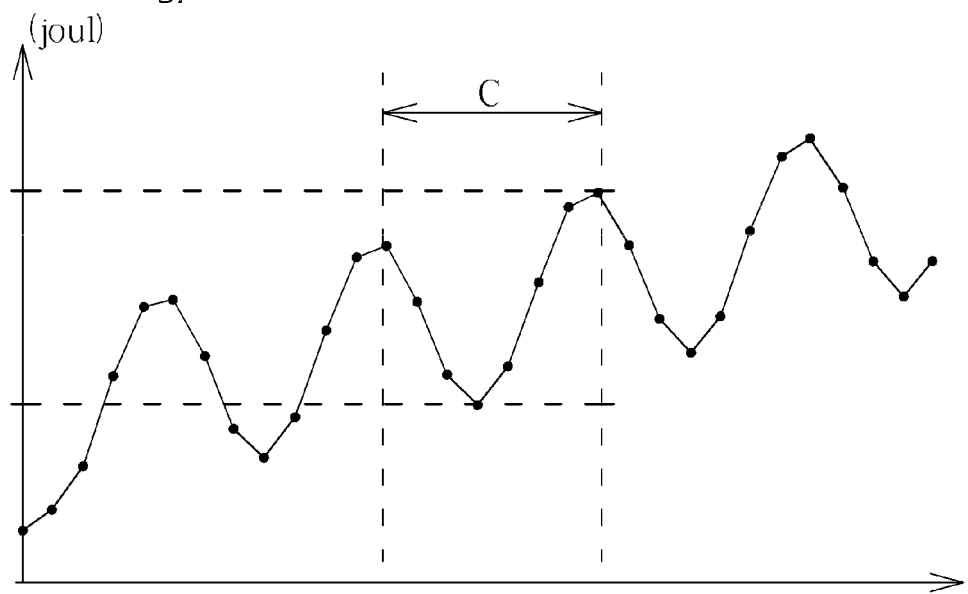

FIG. 9 illustrates a correlation of photo resist critical dimension and minimal energy to entirely expose a photo resist in order to complete the lithography. After completing the correlation according to the results of experiments, a given thickness of a photoresist corresponds to a minimal energy to entirely expose it. If insufficient, the photoresist is not entirely exposed and residues form on the surface of the interlayer dielectric layer 220 to cause the problem of unsuccessful etching. A periodic change is observed in FIG. 9 of the minimal energy to entirely expose the photo resist in accordance with the total thickness of a photo resist and the periodic change is related to the wavelength of the exposure light source. The periodic change is called "a periodic parameter of the exposure light source."

In order to successfully remove all the materials and to expose the etching stop layer 210 during the etching process, the inventor of the present invention suggests choosing the relative minimal points of the curve to be the reference value of the total thickness (T) of the photo resist. Because the total thickness (T) of the photo resist has a half-odd multiple correlation with the periodic parameter C of the exposure light source, therefore:

$$T=C*X/2$$

In addition, please refer to FIG. 8, the total thickness (T) of the photo resist in the first opening should be the summation of the thickness (A) of the interlayer dielectric layer 220 and the thickness (B) of the photo resist layer 230 because the photoresist fills the first opening 221 during the lithographic process, namely:

$$T=A+B$$

So, $$A+B \approx C*X/2$$

$$(A+B)/C \approx X/2$$

After an appropriate exposure light source is chosen, i.e., the periodic parameter is determined, and the thickness (A) of the interlayer dielectric layer 220 is known, the best thickness of the photo resist layer is determined accordingly, so the etching stop layer 210 is exposed after the etching process is completed. For example, if I-line is used as the exposure light source, the thickness error of the photo resist layer 230 may be within ±180 Å of the calculated the best thickness of the photo resist layer. Such error range is usually involved with the wavelength of the exposure light source, and the value is for example only. Current processing devices have ±20 Å or less capability, so the thickness of the photo resist layer 230 is predictable.

Figure 10:
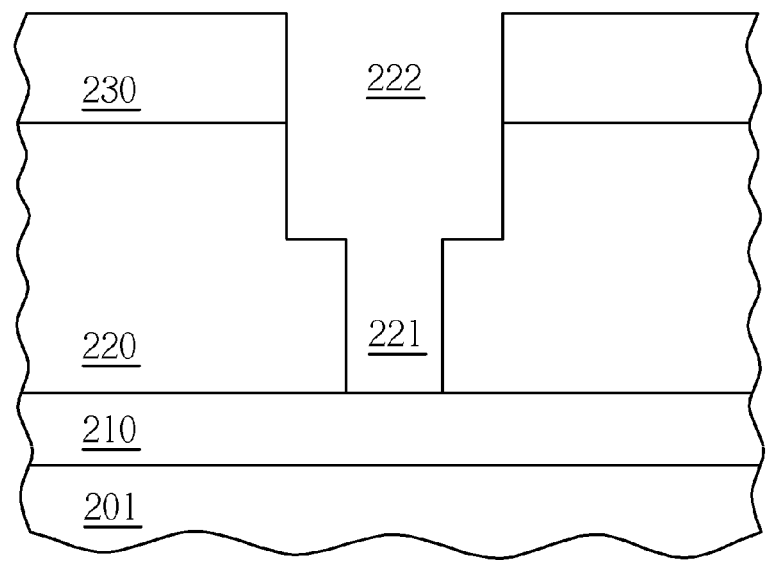

After the best thickness of the photo resist layer is determined, the photo resist layer 230 is used as a hard mask to form the second opening 222 in the interlayer dielectric layer 220 by etching process, as shown in FIG. 10.

After the second opening 222 is constructed, the exposed etching stop layer 210 may be removed by dry or wet etching to further expose the substrate 201. Later, conductive materials, such as copper may fill it to electrically connect the elements such as doping regions, silicides, or metal (not shown) on the substrate 201. If incomplete lithography makes the exposure of the photoresist 230 incomplete, the second opening 222 fails to expose the etching stop layer 210 after the etching is completed because the residue photoresist covers the interlayer dielectric layer 220, it is very difficult to simply rely on the wet etching process for removing the etching stop layer 210 to expose the substrate 201 because most etching recipes are more or less selective to different materials. If the etching stop layer 210 is made of nitride, hot phosphoric acid may be used as the wet etching agent.

After the etching process is completed and the etching stop layer 210 is exposed, conductive materials, such as copper or a barrier layer of Ti, TiN or both may fill the first opening 221 and the second opening 222 to complete the method for forming a dual damascene structure.

Figures 11, 12:
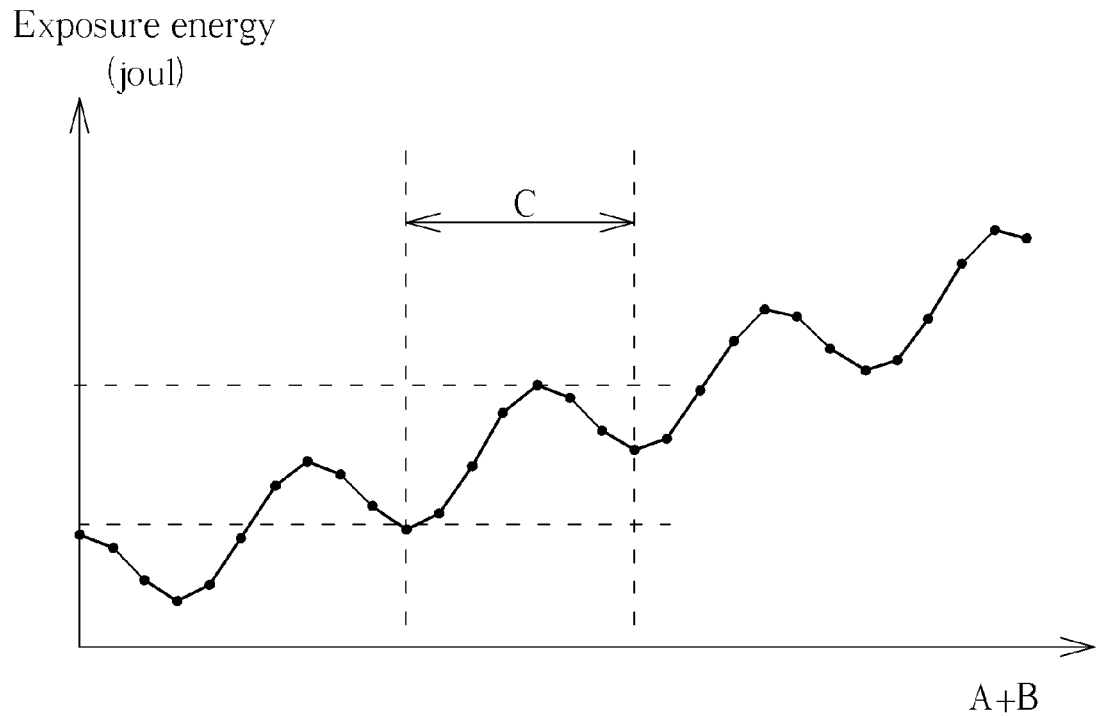

In another preferred embodiment of the present invention, a top anti-reflective coating (TARC) layer 232 may be added after the photo resist layer 230 is formed to facilitate the formation of the photo resist opening 231, as shown in FIG. 12. And, under the influence of the top anti-reflective coating (TARC) layer 232, the inventor of the present invention discovers that the periodic change in FIG. 9 of the photo resist critical dimension in accordance with the total thickness of a photo resist is observed to have a 180° phase change, as shown in FIG. 11, the peak in FIG. 9 now the valley in FIG. 11, but the periodic change remains the same. As a result, the inventor of the present invention suggests, in the presence of the top anti-reflective coating (TARC) layer 232, the correlation among the thickness (A) of the interlayer dielectric layer 220, the thickness (B) the photo resist layer 230 and the periodic parameter (C) of the exposure light source would be:

$$(A+B)/C \approx N$$

where N is a natural number.

In another preferred embodiment of the present invention, the depth of the first opening 221 formed in the interlayer dielectric layer 220 can be controlled so that the first opening 221 does not expose the etching stop layer 210. If the depth of the first opening 221 formed in the interlayer dielectric layer 220 needs controlling, the depth of the first opening 221 determines a discount of the value A+B, between 1 and 0 for example, so that the first opening 221 may have a proper depth after etching process and the discount of the value of A+B is defined as a depth of the first opening 221 that is less than or equal to A. As shown in FIG. 8, if the etching stop layer is exposed, the total thickness to be exposed is A+B. On the other side, if the etching stop layer is not exposed, the total thickness to be exposed is the actual depth of the first opening to be exposed +B. The actual depth of the first opening is considered the discount of A.

The present invention further provides a method for determining the thickness of a photo resist layer. In the method for determining the thickness of a photo resist layer of the present invention, because a periodic parameter derived from the exposure light source is taken into consideration, the correct thickness of the photo resist layer is correctly estimated before the etching process. Through the method of the present invention, the etching operation will result in a correct, expected etching depth.

According to the correlation of the photo resist critical dimension in accordance with the minimal value of the total thickness of a photo resist, the present invention provides a method for determining the thickness of a photo resist layer. In the beginning, a substrate is provided. There are an etching stop layer and an interlayer dielectric layer disposed on the substrate in order. The interlayer dielectric layer has a thickness A. Second, the interlayer dielectric layer is patterned to form a first opening. Later, a photo resist layer with a thickness B is formed on the interlayer dielectric layer. Then, the photo resist layer is patterned by a light source to construct a patterned photo resist layer. Later, the interlayer dielectric layer is again patterned by the patterned photo resist layer to construct a second opening on the first opening by means of a light source and the photo resist layer so as to form a dual damascene structure. The light source determines a periodic parameter C so that B≈(C*X−2A)/2, where X is an odd number. In the method of the present invention, the substrate, the etching stop layer, the interlayer dielectric layer, and the photo resist layer as well as the method to form the first opening and the second opening are similar to what are described earlier, and the details will not be discussed here.

According to the previous formula, as long as the thickness (A) of the interlayer dielectric layer and the periodic parameter C of the exposure light source are known, the thickness (B) of the photo resist layer can be correctly estimated. Thus, a correct etching depth can be reached and all the materials of the interlayer dielectric layer and the photo resist layer in the vias can be thoroughly removed by lithography and etching during the following etching of the interlayer dielectric layer.

In still another preferred embodiment of the present invention, the depth of the first opening formed in the interlayer dielectric layer can be well controlled so that the first opening does not expose the etching stop layer at all. If the depth of the first opening formed in the interlayer dielectric layer needs controlling, the depth of the first opening determines a discount of the value A+B, between 1 and 0 for example, so that the first opening may have a proper depth after etching process. As shown in FIG. 8, if the etching stop layer is exposed, the total thickness to be exposed is A+B. On the other side, if the etching stop layer is not exposed, the total thickness to be exposed is the actual depth of the first opening to be exposed +B. The actual depth of the first opening is considered the discount of A.

The present invention still provides a method for determining the thickness of a photo resist layer. In the beginning, a substrate is provided. There are an etching stop layer and an interlayer dielectric layer disposed on the substrate in order. The interlayer dielectric layer has a thickness A. Second, the interlayer dielectric layer is patterned to form a first opening. Later, a photo resist layer with a thickness B is formed on the interlayer dielectric layer. Afterwards, a top anti-reflective coating (TARC) layer is formed on the photo resist layer. Then, the photo resist layer and the top anti-reflective coating (TARC) layer are patterned by a light source to construct a patterned photo resist layer and a patterned the top anti-reflective coating (TARC) layer. Later, the interlayer dielectric layer is again patterned by the patterned photo resist layer and the patterned the top anti-reflective coating (TARC) layer to construct a second opening on the first opening so as to form a dual damascene structure. The light source has a periodic parameter C so that B≈C*N−A, where N is a natural number. In the method of the present invention, the substrate, the etching stop layer, the interlayer dielectric layer, and the photo resist layer as well as the method to form the first opening and the second opening are similar to what are described earlier, and the details will not be discussed here.

According to the previous formula, as long as the thickness (A) of the interlayer dielectric layer and the periodic parameter C of the exposure light source are known, the thickness (B) of the photo resist layer can be correctly estimated. Thus, a correct etching depth can be reached and all the material of the interlayer dielectric layer and the photo resist layer in the vias can be thoroughly removed by lithography, development and etching during the following etching of the interlayer dielectric layer. An effective metal interconnect structure is hence formed to ensure good electric connection between the elements in the semiconductor.

In still another preferred embodiment of the present invention, the depth of the first opening formed in the interlayer dielectric layer can be well controlled so that the first opening does not expose the etching stop layer at all. If the depth of the first opening formed in the interlayer dielectric layer needs controlling, the depth of the first opening determines a discount of the value A+B, between 1 and 0 for example, so that the first opening may have a proper depth after etching process. If the etching stop layer is exposed, the total thickness to be exposed is A+B. On the other side, if the etching stop layer is not exposed, the total thickness to be exposed is the actual depth of the first opening to be exposed +B. The actual depth of the first opening is considered the discount of A.

Those skilled in the art will readily observe that numerous modifications and alterations of the device and method may be made while retaining the teachings of the invention.

What is claimed is:

1. A method for forming a dual damascene structure, comprising:
   providing a substrate, wherein an etching stop layer and an interlayer dielectric layer are disposed on said substrate in order and said interlayer dielectric layer has a thickness A;
   patterning said interlayer dielectric layer to form a first opening;
   forming a photo resist layer with a thickness B on said interlayer dielectric layer and in said first opening, wherein the photo resist layer directly contacts the interlayer dielectric layer; and
   patterning said photo resist layer by a light source to construct a patterned photo resist layer thereby completely removing said photo resist layer in said first opening;
   after completely removing the photoresist layer in the first opening, patterning said interlayer dielectric layer by said patterned photo resist layer to construct a second opening on said first opening so as to form said dual damascene structure.

2. The method of claim 1, wherein said etching stop layer is selected from a group consisting of silicon carbide, silicon nitride, oxynitride, titanium nitride and a metal.

3. The method of claim 1, wherein said interlayer dielectric layer is selected from a group consisting of silicon oxide, SiOF, SiLK, PSG, BPSG and TEOS.

4. The method of claim 1, wherein said first opening formed in said interlayer dielectric layer does not expose said etching stop layer.

5. The method of claim 4, wherein the depth of said first opening is less than or equal to A.

6. The method of claim 1, wherein said first opening formed exposes said etching stop layer.

7. The method of claim 1, wherein said light source determines a periodic parameter C.

8. A method for forming a dual damascene structure, comprising:
   providing a substrate, wherein an etching stop layer and an interlayer dielectric layer are disposed on said substrate in order and said interlayer dielectric layer has a thickness A;
   patterning said interlayer dielectric layer to form a first opening;
   forming a photo resist layer with a thickness B on said interlayer dielectric layer and in said first opening, wherein the photo resist layer directly contacts the interlayer dielectric layer;
   forming a top anti-reflective coating (TARC) layer on said photo resist layer at a side opposite to the substrate; and
   patterning said photo resist layer and said top anti-reflective coating (TARC) layer by a light source to construct a patterned photo resist layer and a patterned top anti-reflective coating (TARC) layer to remove said photo resist layer in said first opening;
   patterning said interlayer dielectric layer by said patterned photo resist layer and said patterned top anti-reflective coating (TARC) layer to construct a second opening on said first opening so as to form said dual damascene structure.

9. The method of claim 8, wherein said etching stop layer is selected from a group consisting of silicon carbide, silicon nitride, oxynitride, titanium nitride and a metal.

10. The method of claim 8, wherein said interlayer dielectric layer is selected from a group consisting of silicon oxide, SiOF, SiLK, PSG, BPSG and TEOS.

11. The method of claim 8, wherein said first opening does not expose said etching stop layer.

12. The method of claim 11, wherein the depth of said first opening is less than or equal to A.

13. The method of claim 8, wherein said first opening formed exposes said etching stop layer.

14. The method of claim 8, wherein said light source determines a periodic parameter C.

15. A method for determining the thickness of a photo resist layer, comprising:
   providing a substrate, wherein an etching stop layer and an interlayer dielectric layer are disposed on said substrate in order and said interlayer dielectric layer has a thickness A;
   patterning said interlayer dielectric layer to form a first opening;
   forming a photo resist layer with a thickness B on said interlayer dielectric layer and in said first opening, wherein the photo resist layer directly contacts the interlayer dielectric layer; and
   patterning said photo resist layer by a light source to construct a patterned photo resist layer thereby completely removing said photo resist layer in said first opening;
   after completely removing the photo resist layer in the first opening, patterning said interlayer dielectric layer by said patterned photo resist layer to construct a second opening on said first opening so as to form said dual damascene structure, wherein a periodic change is observed of a minimal energy to entirely expose the photo resist layer, and the periodic change is related to a wavelength of the light source, and the periodic change is defined as a periodic parameter C of the light source; the thickness (B) of the photo resist layer is predicted from the thickness (A) of the interlayer dielectric layer and the periodic parameter C of the light source by using the equation $B \approx (C*X-2A)/2$, where X is an odd number.

16. The method of claim 15, wherein the depth of said first opening is less than or equal to A.

17. A method for determining the thickness of a photo resist layer, comprising:
   providing a substrate, wherein an etching stop layer and an interlayer dielectric layer are disposed on said substrate in order and said interlayer dielectric layer has a thickness A;
   patterning said interlayer dielectric layer to form a first opening;
   forming a photo resist layer with a thickness B on said interlayer dielectric layer and in said first opening, wherein the photo resist layer directly contacts the interlayer dielectric layer;
   forming a top anti-reflective coating (TARC) layer on said photo resist layer at a side opposite to the substrate; and
   patterning said photo resist layer and said top anti-reflective coating (TARC) layer by a light source to construct a patterned photo resist layer and a patterned top anti-reflective coating (TARC) layer to remove said photo resist layer in said first opening;
   patterning said interlayer dielectric layer by said patterned photo resist layer and said patterned top anti-reflective coating (TARC) layer to construct a second opening on said first opening so as to form said dual damascene structure, wherein a periodic change is observed of a minimal energy to entirely expose the photo resist layer, and the periodic change is related to a wavelength of the light source, and the periodic change is defined as a periodic parameter C of the light source; the thickness (B) of the photo resist layer is predicted from the thickness (A) of the interlayer dielectric layer and the periodic parameter C of the light source by using the equation $B \approx C*N-A$, where X is a natural number.

18. The method of claim 17, wherein the depth of said first opening is less than or equal to A.

* * * * *